US006236286B1

(12) United States Patent
Hoffmann et al.

(10) Patent No.: US 6,236,286 B1
(45) Date of Patent: May 22, 2001

(54) INTEGRATED ON-BOARD AUTOMATED ALIGNMENT FOR A LOW DISTORTION AMPLIFIER

(75) Inventors: Shlomo Hoffmann, Randolph; George P. Vella-Coleiro, Summit, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/327,538

(22) Filed: Jun. 8, 1999

(51) Int. Cl.[7] .............................. H03F 1/26; H04K 1/02
(52) U.S. Cl. ........................ 333/2; 330/149; 375/296
(58) Field of Search ............................ 330/2, 149, 151; 375/296, 297

(56) References Cited

U.S. PATENT DOCUMENTS

| 4,926,134 | * | 5/1990 | Olver | 330/2 |
| 5,304,945 | * | 4/1994 | Myer | 330/149 |
| 5,386,198 | * | 1/1995 | Ripstrand et al. | 330/151 |
| 5,815,036 | * | 9/1998 | Yoshikawa et al. | 330/151 |

* cited by examiner

Primary Examiner—Robert Pascal
Assistant Examiner—Khanh Van Nguyen
(74) Attorney, Agent, or Firm—Dickstein Shapiro Morin & Oshinsky LLP

(57) ABSTRACT

A low distortion amplifier with an optimization circuit that performs an automated alignment of the amplifier is provided. The optimization circuit includes an extraction circuit designed to extract various signals indicative of the operation of the amplifier under the current operating conditions. A control circuit using information received from the extraction circuit determines the appropriate control settings for key components of the amplifier for the current operating conditions. The optimization circuit ensures that the amplifier output has a desired signal level while also ensuring that the output has minimum or no intermodulation distortion under all operating conditions.

82 Claims, 5 Drawing Sheets

INTEGRATED ON-BOARD AUTOMATED ALIGNMENT FOR A LOW DISTORTION AMPLIFIER

BACKGROUND OF THE INVENTION

1. Field of the Invention

The present invention relates to the field of low distortion, high frequency amplifiers and, more particularly to an integrated on-board automated alignment circuit for low distortion, high frequency amplifiers.

2. Description of the Related Art

In the amplification of a multi-tone high frequency input signal, such as the signals present in a wireless communication application, undesirable intermodulation frequencies are typically produced, resulting in distortion of the output signal (i.e., the amplified input signal). The resulting distortion, typically referred to as intermodulation distortion (IMD), is undesirable and must be eliminated to obtain a distortion free output signal. Recently, low distortion amplifiers capable of amplifying the multi-tone signals while substantially eliminating the intermodulation distortion of the output signal have been developed to counteract the IMD problem.

FIG. 1 illustrates a low distortion amplifier circuit 10 capable of amplifying multi-tone input signals RF_In while substantially minimizing the intermodulation distortion of the output signal RF_Out. The circuit 10 contains a first amplifier circuit 30 comprising a first attenuator 32, phase shifter 34 and amplifier 36 and a second amplifier circuit 20 comprising a second attenuator 22, phase shifter 24 and amplifier 26. The circuit 10 also contains third and fourth attenuators 12, 44, a third phase shifter 46, four couplers 14, 18, 42, 52, and two delay circuits 16, 48.

The input of the third attenuator 12 is connected to receive the input signal RF_In. The third attenuator has a control variable AttIn that can be used to adjust the overall gain of the circuit 10 (as will be described below with reference to FIGS. 3a–3c). The output of the third attenuator 12 is connected to an input port of the first coupler 14, which is configured as a 10 dB power splitter. The coupler 14 is typically a conventional parallel coupler line type that samples power from a direct port and a coupled port of the coupler 14. The direct port of the coupler 14 is connected to an input of the first delay circuit 16. The coupled port of the coupler 14 is connected to an input of the first attenuator 32 of the first amplifier circuit 30. An output of the first delay circuit 16 is connected to the input port of the second coupler 18, which is configured as a 10 dB subtracting device (i.e., it subtracts signal S5 from signal S2 as described below in more detail). The second coupler 18 is typically a conventional parallel coupler line type coupler. The direct port of the coupler 18 is connected to an input of the second attenuator 22 of the second amplifier circuit 20.

The output of the second attenuator 22 is connected to the input of the second phase shifter 24. The output of the second phase shifter 24 is connected to an input of the second amplifier 26. The amplifier 26 is typically a conventional high frequency amplifier operating in class A, AB or B and having a gain GainA on the order of 30 dB to produce output power on the order of 50 W. The output of the second amplifier 26 is connected to the coupled port of the fourth coupler 52, which is configured as a 3 dB combiner. The fourth coupler 52 can be a conventional Wilkinson coupler with proper phase adjustment.

The output of the first attenuator 32 is connected to the input of the first phase shifter 34. The output of the first phase shifter 34 is connected to the input of the first amplifier 36. The first amplifier 36 is typically a conventional high frequency amplifier operating in class A, AB or B and having a gain GainB on the order of 30 dB to produce output power on the order of 50 W. The output of the first amplifier 36 is connected to the input port of the third coupler 42, which is configured as a conventional 30 dB splitter. The direct port of the third coupler 42 is connected to the input of the second delay circuit 48. The output of the second delay circuit 48 is connected to the direct port of the fourth coupler 52. The coupled port of the third coupler 42 is connected to the input of the fourth attenuator 44. The output of the fourth attenuator 44 is connected to the input of the third phase shifter 46. The output of the third phase shifter 46 is connected to the coupled port of the second coupler 18.

In operation, an applied input signal RF_In is attenuated by the third attenuator 12 and then split into two signals S1, S2 by the first coupler 14. Typically, RF_In is a multi-tone high frequency signal consisting of sinusoidal components of a first fundamental frequency and a second fundamental frequency, which is higher than the first fundamental frequency. Both frequencies, however, lie within standard wireless communication frequency bands (e.g., 800 Mhz to 960 Mhz), although the circuit 10 can be used in other applications with lower or higher frequency bands.

Signal S1 is applied to the first amplifier circuit 30 where it is amplified forming amplified signal S3 at the output of the first amplifier 36. Signal S3 will contain some undesirable intermodulation distortion products (IMD) which are in phase with the desired RF portion of the signal. Signal S3 is then input into third coupler 42, which outputs two signals S4, S8 representing the amplified signal S3. Signal S4 is attenuated by the fourth attenuator 44 and phase shifted 180 degrees by the third phase shifter 46 forming signal S5. Signal S5 will be 180 degrees out of phase with delayed signal S2 (described below), but with a small RF portion amplitude. Signal S5 is applied to the second coupler 18. Signal S8 is applied to the second delay circuit 48, which introduces a time delay and thus, outputs a delayed S8 to the fourth coupler 52. Signal S8 will contain a desirable RF portion and an undesirable IMD portion.

Signal S2 is applied to the first delay circuit 16, which introduces a time delay and thus, outputs a delayed S2 to the second coupler 18. The delay ensures that the signals S2 and S5 arrive at the second coupler 18 at the same time. The output of the second coupler 18, signal S6, represents the subtraction of signal S5 from signal S2. Here, only the small RF portion of signal S5 is subtracted due to the second coupler 18. The RF portion of S6 is approximately equal in amplitude, but 180 degrees out of phase with the RF portion of signal S1. S6 also contains an IMD portion from signal S5 since signal S2 does not contain IMD and no cancellation occurs. S6 is amplified by the second amplifier circuit 20 forming signal S7, which is applied to the fourth coupler 52. The IMD portion of signal S6 will be attenuated by the new IMD portion introduced by the second amplifier 26. Thus, signal S7 will have an IMD portion equal in amplitude, but 180 degrees out of phase with the IMD portion in signal S8. The RF portion of signal S7, however, will be in-phase with the RF portion of signal S8.

The desired RF signal portion of the two signals S8 and S7 present at the fourth coupler 52 are in phase with each other and thus, are combined by the fourth coupler 52 to form RF_Out with a high gain (with respect to the input RF_In). The IMD portion of signal S8 will be equal in amplitude to the IMD portion of signal S7, but they will be 180 degrees out of phase with each other and thus, the IMD is substantially canceled. Accordingly, the circuit 10 has a large output power gain with substantially minimized intermodulation distortion.

In order for the circuit 10 to operate properly, the attenuators 22, 32, 44 and phase shifters 24, 34, 46 must be properly balanced. Each attenuator 22, 32, 44 has control variables AttA, AttB, AttF, respectively, that can be set by a system user. Similarly, each phase shifter 24, 34, 46 has control variables PhaseA, PhaseB, PhaseF, respectively, that can also be set by the system user. A special alignment procedure, performed off-line in a laboratory or on the production line, is necessary to find the proper setting of these variables. To speed-up production time, the alignment is typically performed at one frequency and one temperature. The obtained variables are placed into a look-up table and projected to obtain circuit performance for the remainder of the circuit's operational range.

This approach, however, may generate inaccurate predictions due to several factors, such as unequal gains, IMD performance and temperature response of the amplifier circuits 20, 30. In addition, the "double function" of the attenuators and phase shifters (i.e., attenuators often introduce a phase shift as well as attenuating, while phase shifters alter their insertion lags during phase shifting both as a function of their control variables), tend to introduce improper compensations leading to inefficient operation of the low distortion amplifier circuit. Accordingly, there is a desire and need for a continuous automated alignment mechanism for low distortion, high frequency amplifiers.

In addition, it is desirable that any alignment mechanism be integrated on-board with the amplifier so that the alignment can occur out in the field during normal operation of the amplifier, as opposed to being performed in a laboratory or at the production line. Accordingly, there is a desire and need for an integrated onboard alignment mechanism for a low distortion, high frequency amplifier.

SUMMARY OF THE INVENTION

The present invention provides a continuous automated alignment mechanism for low distortion, high frequency amplifiers.

The present invention also provides an integrated on-board alignment mechanism for a low distortion, high frequency amplifier.

The above and other features and advantages of the invention are achieved by integrating a low distortion amplifier with an optimization circuit that performs an automated alignment of the amplifier. The optimization circuit includes an extraction circuit designed to extract various signals indicative of the operation of the amplifier under the current operating conditions. A control circuit using information received from the extraction circuit determines the appropriate control settings for key components of the amplifier for the current operating conditions. The optimization circuit ensures that the amplifier output has a desired signal level while also ensuring that the output has minimum or no intermodulation distortion under all operating conditions.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 1:
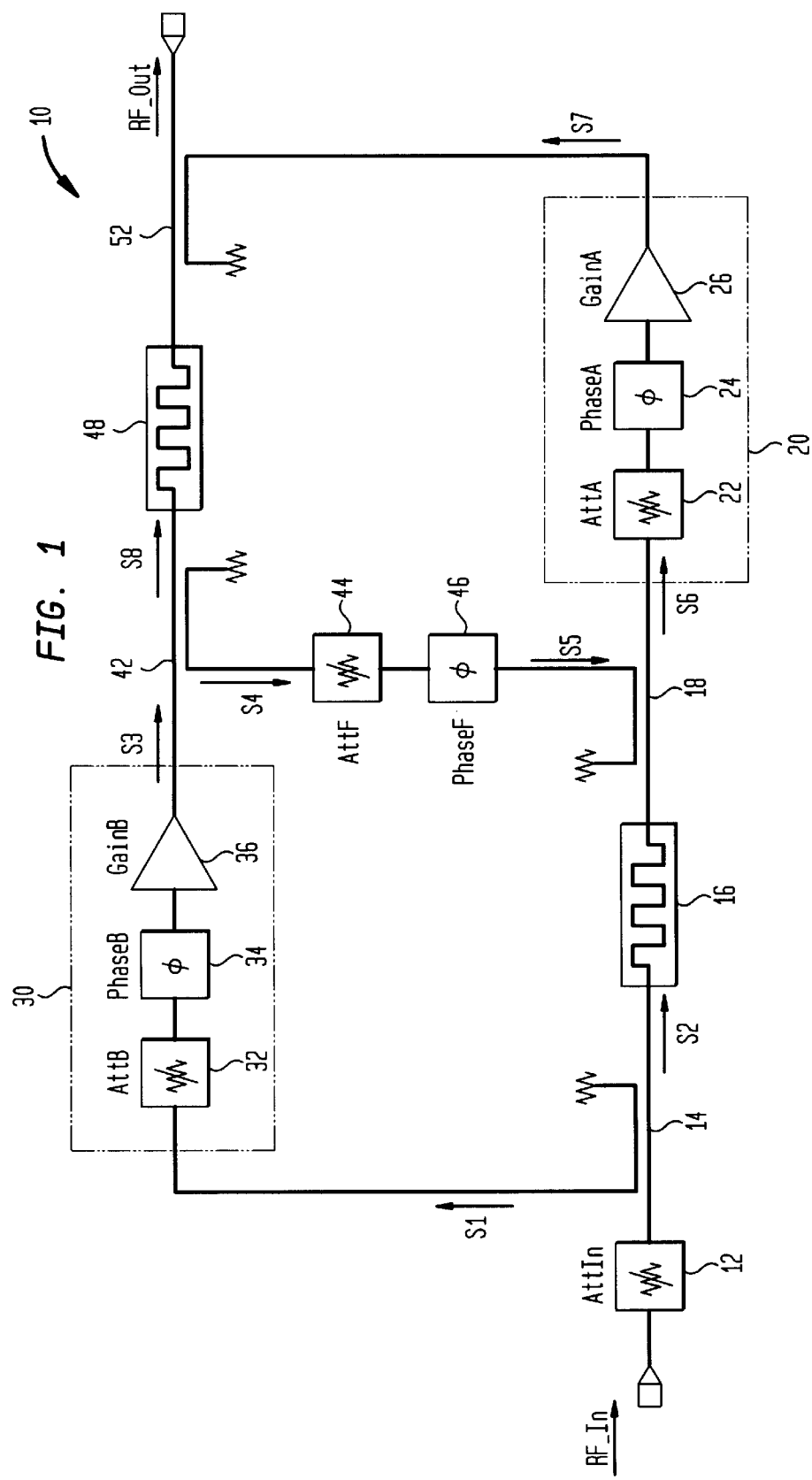
FIG. 1 is a circuit diagram illustrating a low distortion amplifier circuit.
Figure 2:
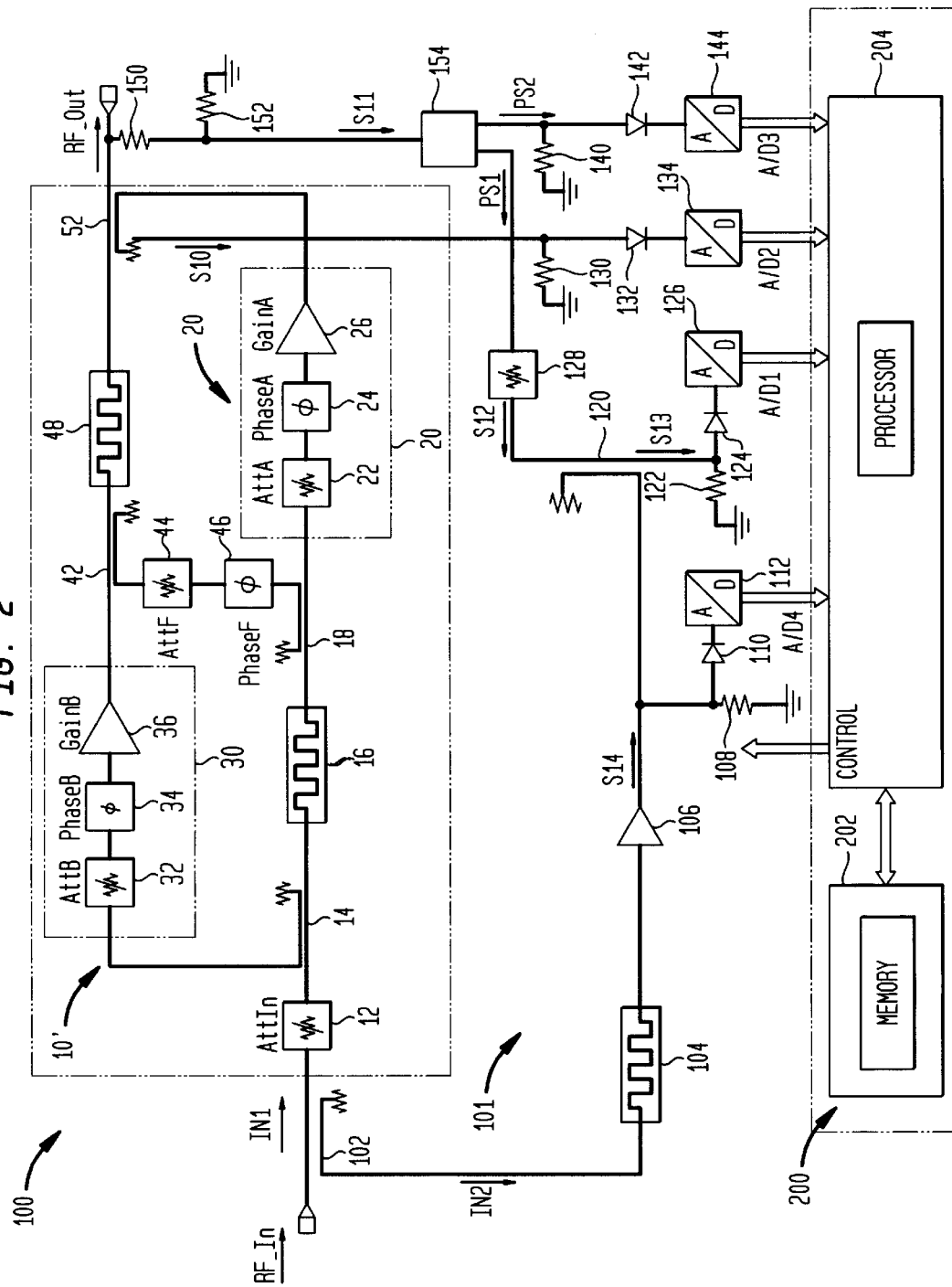
FIG. 2 is a circuit diagram illustrating a low distortion amplifier circuit with on-board automated alignment constructed in accordance with the present invention.

Referring now to the drawings where similar reference numerals designate like elements, there is shown in FIG. 2 a circuit 100 for a low distortion amplifier with on-board automated alignment constructed in accordance with the present invention. The circuit 100 includes a modified FIG. 1 circuit denoted as 10', an indication extraction circuit 101 and a control circuit 200. The control circuit 200 and the extraction circuit 101 form an optimization circuit, which, as will be described below, performs an automated alignment of the amplifier circuit 10' and thus, ensures that the output RF_Out of the circuit 100 has a desired signal level while also ensuring that the output has minimum or no intermodulation distortion under all operating conditions.

The circuit 10' is essentially the same as circuit 10 described above with reference to FIG. 1, with two minor exceptions. First, instead of being directly connected to the input signal RF_In, the input of third attenuator 12 is connected to a signal INI output from a fifth coupler 102, which is configured as a 10 dB splitter and splits the input signal RF_In into two signals IN1 and IN2. Second, a signal S10 output from the isolated port of the fourth coupler 52 (unused in circuit 10 of FIG. 1) is used by the extraction circuit 101 to help optimize the circuit 100 (described in detail below). Thus, the circuit 10' will receive a portion of the input signal INI and produce the desired output RF_Out with no or minimum intermodulation distortion (as described above with reference to FIG. 1).

The extraction circuit 101 contains fifth and sixth couplers 102, 120, delay circuit 104, amplifier 106, four diodes 110, 124, 132, 142, four analog-to-digital converters (ADC) 112, 126, 134, 144, an attenuator 128, a sampling resistor 150, five shunt resistors 122, 130, 140, 152, 108 and a power divider circuit 154.

The input of the fifth coupler 102 is connected to receive the input signal RF_In. The fifth coupler 102 is configured as a 10 dB power splitter. The coupler 102 may be a conventional parallel coupler line type coupler. The direct port of the coupler 102 is connected to the input of the attenuator 12 of the amplifier circuit 10'. The coupled port of the fifth coupler 102 is connected to an input of the third delay circuit 104.

The output of the delay circuit 104 is connected to the input of the third amplifier 106. The output of the amplifier 106 is connected to the parallel combination of the resistor 108 and the first diode 110. The output of the amplifier 106 is also connected to the coupled port of the sixth coupler 120, which is configured as a 3 dB combiner. The output of diode 110 is connected to the input of ADC 112. The output of ADC 112 is connected to an input of the control circuit 200.

The isolated port of the fourth coupler 52 of circuit 10' is connected to the second diode 132. The output of the second diode 132 is connected to the input of the second ADC 134. A shunt resistor 130 is also connected between a ground potential and the input of the second diode 132. The output of ADC 134 is connected to an input of the control circuit 200.

The sampling resistor 150 is connected between the output port, RF_Out, of the fifth coupler 52 and the input of the power divider circuit 154. The sampling resistor 150 has a value that is transparent to an output transmission line. One exemplary value for the sampling resistor 150 would be approximately 1K Ohms. A shunt resistor 152, having a very small value relative to the sampling resistor 150 is connected between the sampling resistor 152 and a ground potential. If the sampling resistor 150 has a value of 1K Ohms, for example, then the shunt resistor 152 will have a value of approximately 50 Ohms. The power divider circuit 154 may be a simple resistor-network power divider or it may also be a 3 dB coupler.

One output of the power divider circuit 154 is connected to the input of the third diode 142. The output of the third diode 142 is connected to the input of the third ADC 144. A shunt resistor 140 is also connected between a ground potential and the input of the third diode 142. The output of ADC 144 is connected to an input of the control circuit 200.

A second output of the power divider circuit 154 is connected to the input of the fifth attenuator 128. The output of the fifth attenuator 128 is connected to the direct port of the coupler 120. The input port of the coupler 120 is directly connected to the fourth diode 124. The output of the diode 124 is connected to the input of the fourth ADC 126. A shunt resistor 122 is also connected between a ground potential and the input of the fourth diode 124. The output of ADC 126 is connected to an input of the control circuit 200.

In operation, the input signal RF_In is applied to the input of the fifth coupler 102 which outputs signal INI to the third attenuator 12 of the amplifier circuit 10' and signal IN2 to the third delay circuit 104. The first signal IN 1 is amplified by the amplifier circuit 10', as described above with reference to FIG. 1, to obtain the desired output RF_Out. RF_Out is sampled by the sampling resistor 150, which when coupled with the shunt resistor 152 serves as a 22 dB attenuator and creates signal S11. Signal S11 is applied to the power divider circuit 154 and is split into two signals PS1 and PS2. Both PS1 and PS2 are representative of the sampled RF_Out signal.

The PS2 output signal is applied to the third ADC 144 (via diode 142). The third ADC 144 digitizes the PS2 signal into signal A/D3, which is sent to the control circuit 200. The A/D3 signal is a digital representation of the current RF value of the output signal RF_Out of the circuit 100 and will be used by the control circuit 200 to properly set the control variables AttA, AttB, AttF, PhaseA, PhaseB, PhaseF. The other output of the power divider circuit 154, i.e., signal PSI is applied to the direct port of coupler 120 (via attenuator 128), which is serving as a 3 dB combiner.

Signal IN2, which is representative of the input signal RF_In, is delayed by the third delay circuit 104 and amplified by amplifier 106 to form signal S14. Signal S14 is applied to the coupled port of coupler 120. Provided that the phases of the signals S14 and PSI are correct, the signals should cancel. Any output signal S13 from the coupler 120 represents the total IMD of the amplifier circuit 10'. Signal S13 is applied to the fourth ADC 126 (via diode 124). The fourth ADC 126 digitizes the S13 signal into signal A/D1, which is sent to the control circuit 200. The A/D 1 signal is a digital representation of the current value of the output IMD of the circuit 10', when the input signal RF_In is a multi-tone signal, or Spectral Regrowth if the input signal RF_In is a CDMA signal. A/D1 will be used by the control circuit 200 to properly set the control variables AttA, AttB, AttF, PhaseA, PhaseB, PhaseF.

Signal S10, which is output from the isolated port of the fourth coupler 52 serves as an indication for equal gains at the first and second amplifier circuits 20, 30. That is, if both the first and second amplifier circuits 20, 30 have the same gain, then signal S10 will be at a minimum. Likewise, the signal S10 approaches a maximum value as the gains of the first and second amplifier circuits 20, 30 become increasingly unequal. Signal S10 is applied to the second ADC 134 (via diode 132). The second ADC 134 digitizes the S10 signal into signal A/D2, which is sent to the control circuit 200. The A/D2 signal is a digital representation of the "equal gain" indication for the first and second amplifier circuits 20, 30. As previously noted, signal A/D2 will be at a minimum when the gains are equal. A/D2 will be used by the control circuit 200 to properly set the control variables AttA, AttB, AttF, PhaseA, PhaseB, PhaseF.

Signal S14 is also applied to the first ADC 112 (via diode 110). The first ADC 112 digitizes the S14 signal into signal A/D4, which is sent to the control circuit 200. The A/D4 signal is a digital representation of the current RF value of the input signal RF_In and will be used by the control circuit 200 to properly set the control variable AttIn.

The control circuit 200 may be a processor 204 connected to or having a memory circuit 202. The control circuit 200 will input signals A/D1, A/D2, A/D3 and A/D4 from the extraction circuit 101 and output control signals CONTROL to set the various control variables AttIn, AttA, AttB, AttF, PhaseA, PhaseB, PhaseF of the amplifier circuit 10' so that the output of the circuit 100 has a desired signal level while also ensuring that the output contains no or minimum intermodulation distortion under all operating conditions (described below in detail with reference to FIGS. 3a–3c). It should be appreciated that the control circuit 200 could also be implemented in hardware or an application specific integrated circuit (ASIC) or a combination of hardware and software.

Figure 3A:
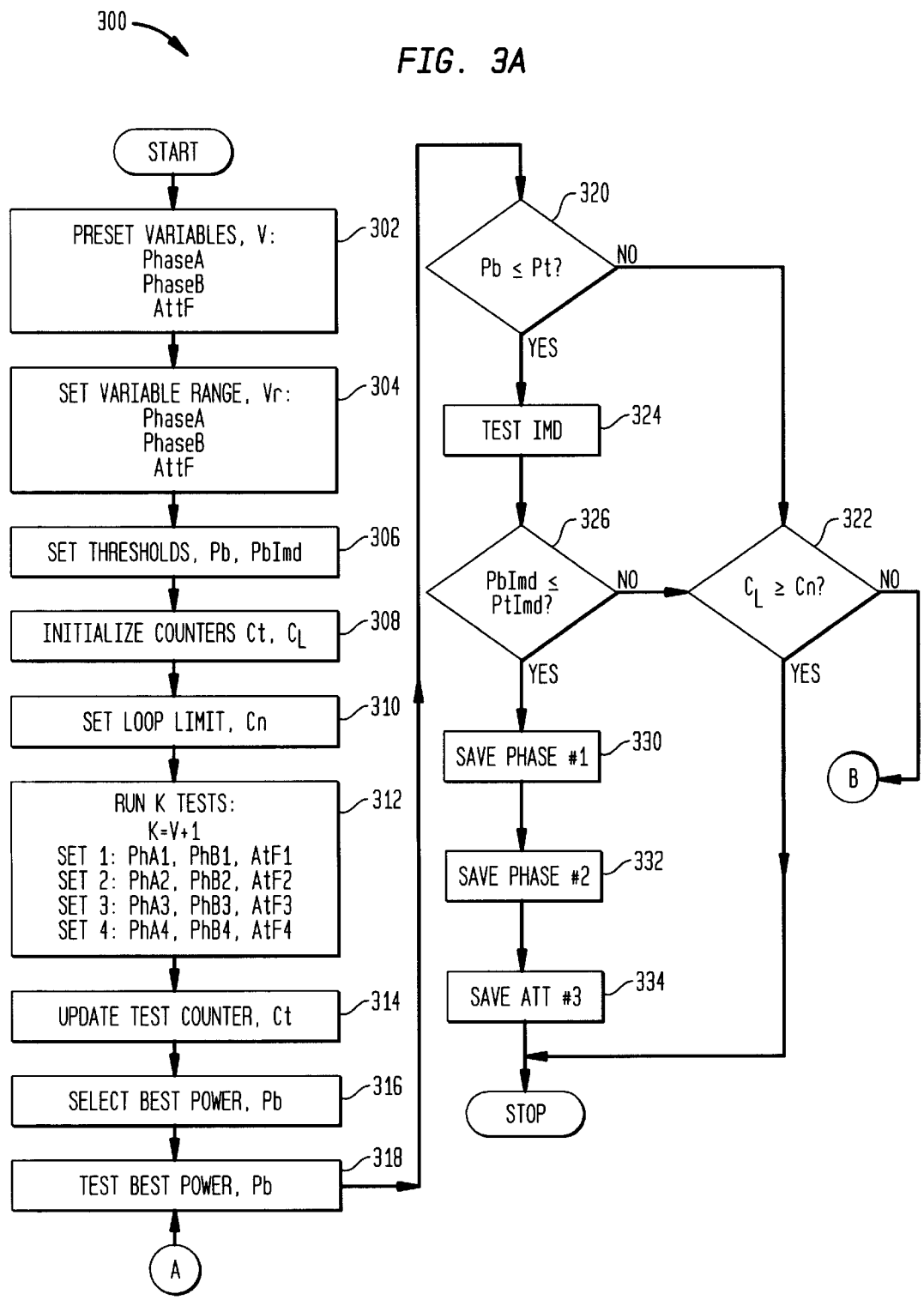
FIGS. 3a–3c illustrate in flowchart form an exemplary automated method for aligning the low distortion amplifier circuit illustrated in FIG. 2.
Figure 3B:
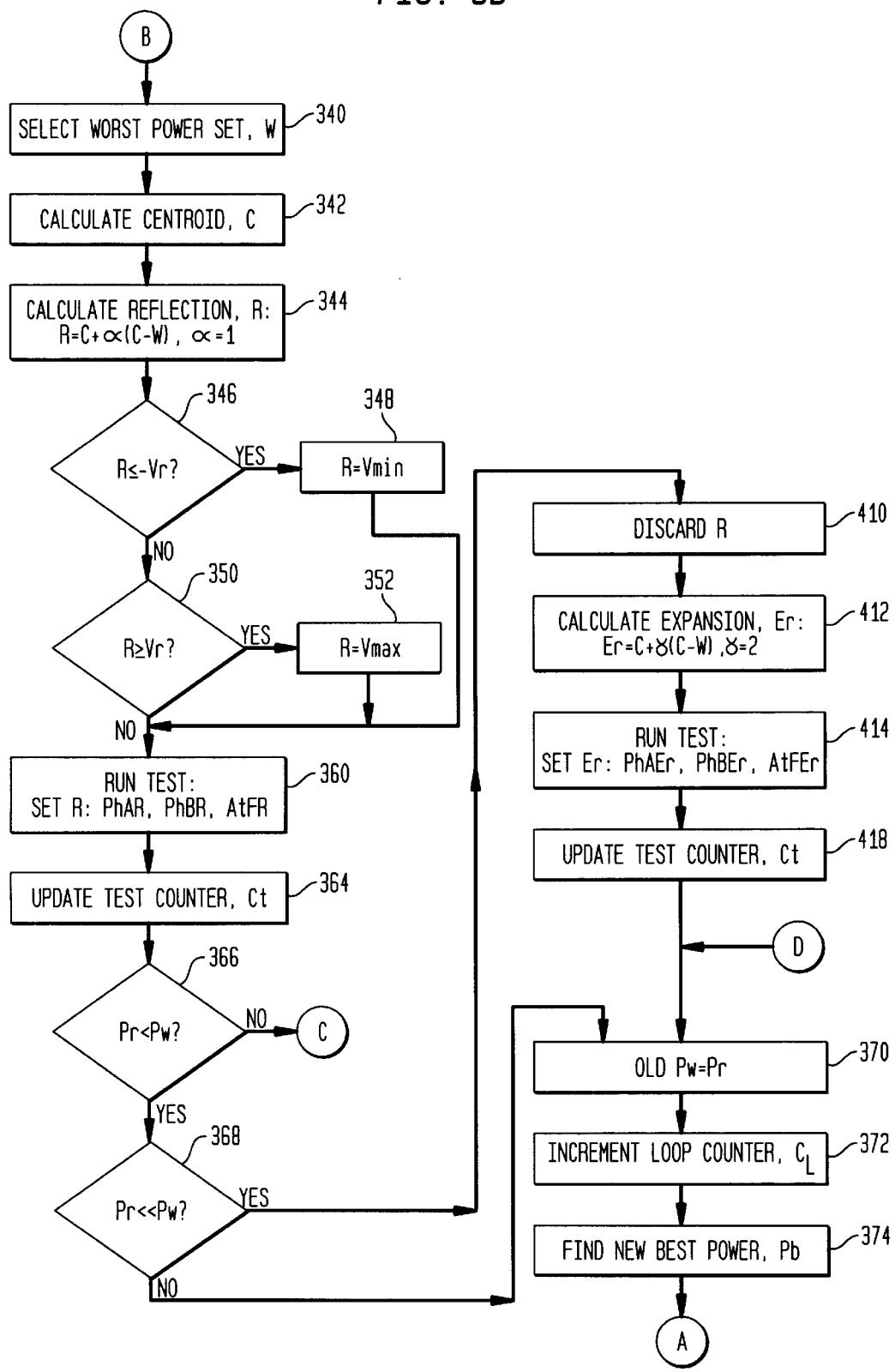
Figure 3C:
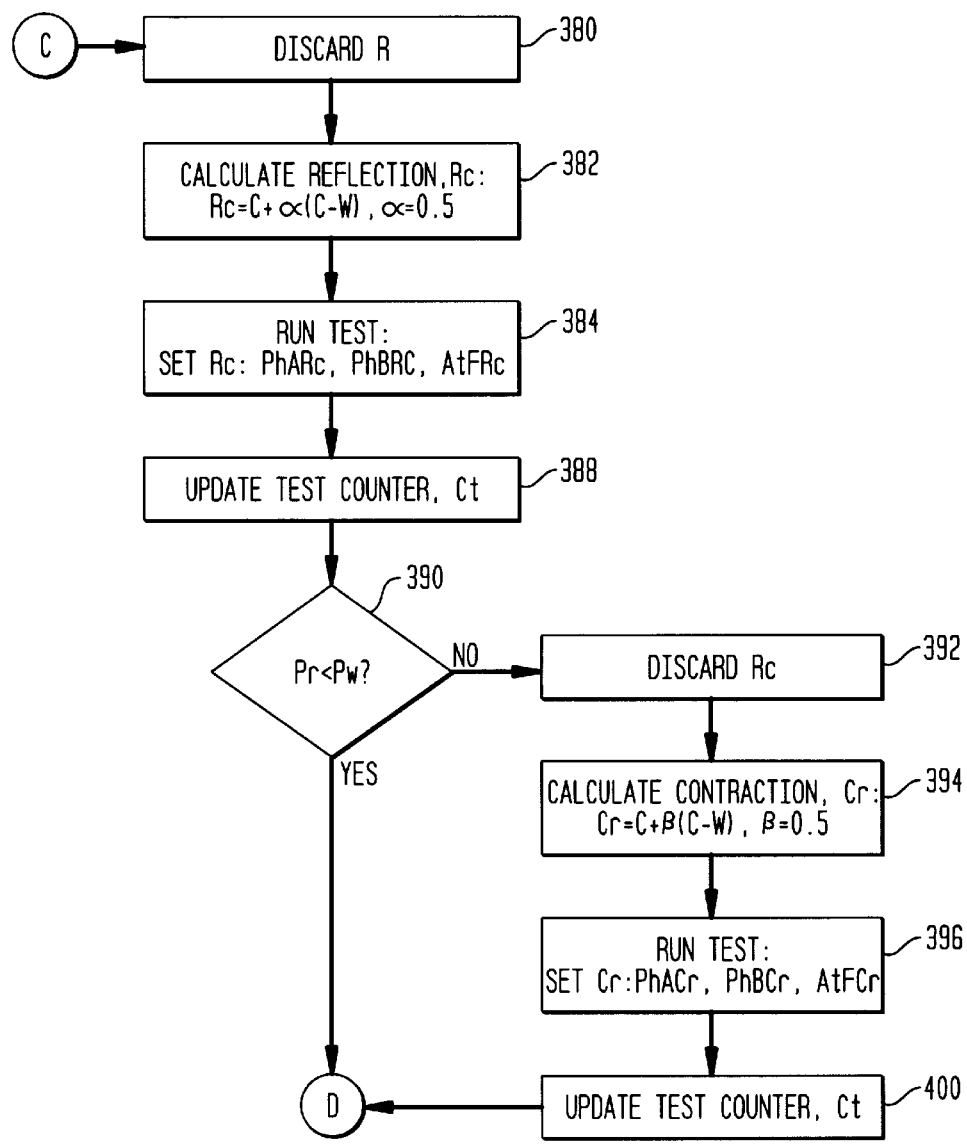

FIGS. 3a–3c illustrate in flowchart form an exemplary automated method 300 for aligning the low distortion amplifier circuit 100 having an on-board automated alignment (illustrated in FIG. 2). As will be described below, the method 300 monitors the values of the signals A/D1 (representing the output IMD) and A/D2 (representing equal gain of the first and second amplifier circuits 20, 30) to determine proper alignment of the circuit 100 (FIG. 2). Proper alignment is achieved when the signals A/D1, A/D2 are at a predetermined minimum. Signal A/D3 is used to adjust the output power to a fixed level to ensure that false IMD caused by insufficient output power does not occur. Signals A/D3 and A/D4 will eventually be used to adjust the final gain setting (via the AttIn control setting for the third attenuator 12) of the circuit 100 (FIG. 2). That is, A/D3 minus A/D4 will yield the current gain of the circuit 100, which can then be compared to a desired gain. Any adjustments needed to achieve the desired gain are made by adjusting AttIn.

It is desired that the method 300 utilize a modified simplex method technique to properly adjust the various control settings. Briefly, and is well known in the art, the simplex method is a procedure for adjusting variables (e.g., control variable settings of circuit 100) to find settings for these variables that achieve the best possible outcome for the system (e.g., proper amplification with the gains of the first and second amplifier circuits being equal and minimum IMD in the output signal RF_Out). The simplex method can handle numerous variables. For the circuit 100 illustrated in FIG. 2, the variables may include any or all of the control variables AttA, AttB, AttF, PhaseA, PhaseB, and PhaseF.

As is known in the art, the simplex method begins with an initial V+1 tests or trials, where V represents the number of variables being adjusted to achieve the best possible outcome. Thus, if two variables are going to be adjusted, then there will be three initial tests. Each test should include different settings for at least one or any of each variable. The settings of each test should be sufficiently spread-out from each other so that that the initial tests encompass a large range of settings. The initial tests form the "simplex."

After the initial tests are run and the outcomes analyzed, the individual test having the least favorable outcome is rejected and is replaced by a new test having different variable settings. Thus, there are always V+1 test results. The variables for the new test are calculated by a "reflection" into the original simplex, but are typically selected to be opposite to the variables leading to the undesirable outcome. The new test is run and a new least favorable outcome is determined and one of the V+1 tests is replaced by another new test. This procedure continues until a desired outcome is achieved. Once the desired outcome is achieved, the simplex method terminates and the variable settings resulting in the desired outcome are saved and subsequently used by the system.

Referring to FIGS. 3a–3c, an exemplary automated method 300 for aligning the low distortion amplifier circuit 100 (illustrated in FIG. 2) is shown. It is desirable that the method 300 be performed by the control circuit 200 (FIG. 2). If the control circuit 200 is implemented as a processor 204 communicating with a memory circuit 202, then the method 300 will be implemented as a software program executed by the processor 204, with the program and results of the method 300 being stored in the memory circuit 202. It should be appreciated, however, that the method 300, as well as the control circuit 200, could be implemented in hardware, ASIC or any combination of hardware and software and the method 300 of the present invention is not be limited to a microprocessor executing software. The method 300 may be run out in the field so that the circuit 100 is aligned for the current operating conditions. This way, factors such as operating temperature will be accounted for during implementation of the method 300.

In this exemplary method 300, only control variables PhaseA, PhaseB and AttF will be used for illustrative purposes. It should be appreciated that any combination of the control variables AttA, AttB, AttF, PhaseA, PhaseB, and PhaseF may be processed by the method 300. Control variables that are not processed by the method 300 will be set to default values based on past alignments (i.e., experience). The variables PhaseA, PhaseB and AttF will be collectively referred to herein as "V." At step 302, the selected control variables PhaseA, PhaseB and AttF are preset to initial values so that the circuit 100 may be operational. These initial values may be, for example, a mid-range value for each variable or may be some other value chosen based on past alignments (i.e., experience). Settings for the PhaseA and PhaseB are in degrees/volt, while settings for the AttF are in gain/volt. At step 304, ranges for the control variables V may be set so that the method 300 selects only values within each variables range. The ranges for the control variables V will be collectively referred to as "Vr."

At step 306, the desired or threshold power Pt and the desired or threshold IMD PtImd are selected. The threshold power Pt represents a minimum desired value for the "equal gain" of amplifiers 20 and 30 (illustrated in FIG. 2). That is, the threshold power Pt is set to a value where the gains of the first and second amplifiers 20, 30 are substantially equal. As stated above, signal A/D2 represents the equal gain of the first and second amplifier circuits 20, 30 and will be compared to Pt to determine when the signal A/D2 is at a minimum. The threshold IMD PtImd is set to a value where the output IMD will be at a minimum. As stated above, signal A/D1 represents the output IMD of the circuit 100 and will be compared to PtImd to determine when the signal A/D1 is at a minimum.

At step 308, a test counter Ct representing the number of tests performed is initialized to zero. A test represents loading amplifier circuit 10' (FIG. 2) to a variable set and then comparing the power values of A/D3 or A/D1 to the thresholds Pt or PtImd (described below at step 320). Loop counter $C_L$ is also initialized to zero. At step 310, a number-of-loop limit Cn is set to a maximum number of test loops desired to be run by the method 300. This limit Cn prevents the method 300 from looping endlessly if the desired A/D1 and A/D2 signals are not achieved.

At step 312, the initial K tests are created and run, where K=V+1 (V represents the number of variables). Since three variables V are being adjusted, there will be four initial tests. The four initial tests are represented by four different sets of variables, individually labeled as set 1, set 2, set 3 and set 4. Set 1 includes settings PhA1, PhB1, AtF1 for the variables PhaseA, PhaseB and AttF, respectively. Similarly, set 2 includes settings PhA2, PhB2, AtF2, set 3 includes settings PhA3, PhB3, AtF3 and set 4 includes settings PhA4, PhB4, AtF4. The test settings are collectively referred to herein as test settings PhA, PhB and AtF.

Each test is run when the control circuit 200 sets the control variables PhaseA, PhaseB and AttF (via control signals CONTROL in FIG. 2) to the values of within one of the test sets. That is, to run the first test based on set 1, for example, PhaseA is set to PhA1, PhaseB is set to PhB1 and AttF is set to AtF1. The extracted signals A/D1, A/D2, A/D3, A/D4 will be indicative of the performance of the amplifier circuit 100 (FIG. 2) based on the control settings used in the test. After each of the V+1 tests are run, there will be V+1 sets of extracted signals A/D1, A/D2, A/D3, A/D4.

At this point, the test counter Ct can be incremented (step 314). The current value of Ct will be V+1, or four for this example. At steps 316–318, the best power Pb is selected from the four sets of extracted signals (i.e., the signal A/D2 with the lowest value) and tested (i.e., compared to the threshold power Pt). At step 320, it is determined if the best power Pb is less than or equal to the threshold power Pt (which represents a minimum desired value for the "equal gain" of amplifiers 20 and 30 illustrated in FIG. 2). If the selected best power Pb is less than or equal to the threshold power Pt, then the method 300 continues at step 324 where the extracted IMD (i.e., signal A/D1) associated with the test having the best power Pb is tested (i.e., compared to the threshold IMD Imdt). This extracted IMD is hereinafter referred to as PbImd. At step 326 it is determined if PbImd is less than or equal to the PtImd. If the PbImd is less than or equal to the PtImd, then the method 300 has properly aligned the low distortion amplifier circuit of the present invention. The values of the control variables used in the test are then stored away in steps 330–334 and the method 300 terminates. At this point, the other extracted signals A/D3 and A/D4 can be used to ensure that the circuit 100 has the desired gain. That is, A/D3 minus A/D4 will yield the current gain of the circuit 100, which can then be compared to a desired gain. Any adjustments needed to achieve the desired gain are made by adjusting AttIn of the third attenuator 12 (FIG. 2).

If the PbImd is greater than the PtImd (step 326) or if the best power Pb is greater than the threshold power Pt (step 320), the method 300 continues at step 322 to determine if the method 300 should make another test loop. That is, at step 322, it is determined if the loop counter $C_L$ is greater than or equal to the loop limit Cn. If the loop counter CL is greater than or equal to the loop limit Cn, the method 300 terminates. At this point, desired output power and IMD levels have not been found and the method 300 must be re-run.

If the loop counter $C_L$ is less than or equal to the loop limit Cn (step 322), the method 300 continues at step 340, where the test set with the worst power is selected. This set is referred to herein as set W and will contain {W1, W2, W3} respectively representing the test settings PhA, PhB and AtF settings resulting in the worst power.

At this point, the method 300 performs conventional simplex method processing to replace the worst case set W with a new test set. At step 342, a centroid set C containing {C1, C2, C3} representing centroids for each test setting PhA, PhB and AtF used in the tests. C1, which represents the centroid for test setting PhA will be set to $\Sigma_{x=1}^{4} PhAx/4$. C2, which represents the centroid for test setting PhB will be set to $\Sigma_{x=1}^{4} PhBx/4$. C3, which represents the centroid for test setting AtF will be set to $\Sigma^{x=1 4} AtFx/4$.

Once the centroids C are calculated, a reflection set R is calculated at step 344. The reflection R will equal $C+\alpha^*(C-W)$, where $\alpha=1$. The reflection set R contains {R1, R2, R3}. R1 represents the reflection for the first test setting PhA and equals C1+(C1−W1). R2 represents the reflection for the second test setting PhB and equals C2+(C2−W2). R3 represents the reflection for the third test setting AtF and equals C3+(C3−W3). The reflection R is then compared to a reflection range Vr (at step 346).

If at step 346 the reflection R is less than or equal to the minimum defined in Vr, the reflection R is set to the minimum Vmin (step 348) and the method 300 continues at step 360. If at step 346 it is determined the reflection R is greater than the minimum of reflection range Vr, the method continues at step 350 to determine if the reflection R is greater than or equal to a maximum of the range Vr. If at step 350 it is determined that the reflection R is greater than or equal to the maximum, the reflection R is set to the maximum Vmax (step 352) and the method 300 continues at step 360. If at step 350 it is determined that the reflection R is less than the maximum, the method 300 continues at step 360.

At step 360, the reflection R is used as a new test. The new test has a set containing PhAR, PhBR and AtFR representing the control variables PhaseA, PhaseB and AttF, respectively. The new test is run when the control circuit 200 sets the control variables PhaseA, PhaseB and AttF (via control signals CONTROL in FIG. 2) to the values of PhAR, PhBR and ATFR The extracted signals A/D1, A/D2, A/D3, A/D4 will be indicative of the performance of the amplifier circuit 100 (FIG. 2) based on the control settings used in the new test. After the test utilizing the reflection test settings is run, there will be a new set of extracted signals A/D1, A/D2, A/D3, A/D4. At this point, the test counter Ct can be incremented (step 364).

At step 366, the signal A/D2 associated with the reflection R test, Pr, is compared to the worst case power Pw. If at step 366 it is determined that the reflection power Pr is less than the worst case power Pw, the method continues at step 368 where it is determined if the reflection power Pr is "too less" (i.e., much smaller) than the worst case power Pw. The term "too less" refers to a difference between the reflection power Pr and the worst case power Pw that is greater than a predetermined difference threshold, which is set by based upon past alignments and experience with simplex methods. If the reflection power Pr is too less than the worst case power Pw, the reflection will be discarded and thus, the method 300 continues at step 410. If at step 368 it is determined that the reflection power Pr is not too less than the worst case power Pw, the method 300 continues at step 370. At this point, the reflection test set R replaces the worst case set W and becomes part of the V+1 tests.

At step 370, the old worst case power Pw is set to the current reflection or new test power Pr. The test counter Ct is incremented (step 372) and a new best power Pb is determined from the V+1 tests (374). Once a new best power Pb is determined, the method 300 continues at step 318, where it will be tested (i.e., compared to the threshold power Pt as described above).

If at step 368 it is determined that the reflection power Pr is too less than the worst case power Pw, the method 300 continues at step 410. At step 410 the reflection R is discarded. At step 412, an expansion set Er is calculated. Er equals $C+\gamma^*(C-W)$, where $\gamma$ equals 2. The expansion set Er contains {Er1, Er2, Er3 }. Er1 represents the expansion for the first test setting PhA and equals C1+2*(C1−W1). Er2 represents the expansion for the second test setting PhB and equals C2+2*(C2−W2). Er3 represents the expansion for the third test setting AtF and equals C3+2*(C3−W3).

A step 414, the expansion Er is used as a new test. The new test has a set containing PhAEr, PhBEr and AtFEr representing the control variables PhaseA, PhaseB and AttF, respectively. This expansion set becomes part of the V+1 tests. The new test is run when the control circuit 200 sets the control variables PhaseA, PhaseB and AttF (via control signals CONTROL in FIG. 2) to the values of PhAEr, PhBEr and AtFEr. The extracted signals A/D1, A/D2, A/D3, A/D4 will be indicative of the performance of the amplifier circuit 100 (FIG. 2) based on the control settings used in the new test (based on PhAEr, PhBEr and AtFEr). After the test utilizing the expansion test settings is run, there will be a new set of extracted signals A/D1, A/D2, A/D3, A/D4. At this point, the test counter Ct can be incremented (step 418) and the method continues at step 370 where the old worst case power Pw is set to the expansion or new test power Pr.

If at step 366 it is determined that the reflection power Pr is greater than the worst case power Pw, the method continues at step 380. At step 380, the reflection R is discarded. At step 382, a new compressed reflection Rc is calculated. The reflection Rc will equal $C+\alpha^*(C-W)$, where $\alpha=0.50$. The reflection set Rc contains {Rc1, Rc2, Rc3}. This new reflection set Rc becomes part of the V+1 tests. Rc1 represents the new reflection for the first test setting PhA and equals C1+0.50*(C1−W). Rc2 represents the new reflection for the second test setting PhB and equals C2+0.50*(C2−W2). Rc3 represents the new reflection for the third test setting AtF and equals C3+0.50*(C3−W3). A step 384, the new reflection Rc is used as a new test. The new test has a set containing PhARc, PhBRc and AtFRc representing the control variables PhaseA, PhaseB and AttF, respectively. The new test is run when the control circuit 200 sets the control variables PhaseA, PhaseB and AttF (via control signals CONTROL in FIG. 2) to the values of PhARc, PhBRc and AtFRc. The extracted signals A/D1, A/D2, A/D3, A/D4 will be indicative of the performance of the amplifier circuit 100 (FIG. 2) based on the control settings used in the new test. After the test utilizing the new reflection test set is run, there will be a new set of extracted signals A/D1, A/D2, A/D3, A/D4. At this point, the test counter Ct can be incremented (step 388).

At step 390, the signal A/D2 associated with the new reflection Rc test, Pr, is compared to the worst case power Pw. If at step 390 it is determined that the new reflection power Pr is less than the worst case power Pw, the method continues at step 370 where the old worst case power Pw is set to the expansion or new test power Pr.

If at step 390 it is determined that the new reflection power Pr is not less than the worst case power Pw, the method continues at step 392. At step 392, the new reflection Rc is discarded. At step 394, a contraction set Cr is calculated. Cr equals $C+\beta*(C-W)$, where $\beta$ equals $-0.50$. The contraction set Cr contains $\{Cr1, Cr2, Cr3\}$. Cr1 represents the contraction for the first test setting PhA and equals $C1-0.50*(C1-W1)$. Cr2 represents the contraction for the second test setting PhB and equals $C2-0.50*(C2-W2)$. Cr3 represents the contraction for the third test setting AtF and equals $C3-0.50*(C3-W3)$.

A step 394, the contraction Cr is used as a new test. The new test has a set containing PhACr, PhBCr and AtFCr representing the control variables PhaseA, PhaseB and AttF, respectively. This contraction set becomes part of the V+1 tests. The new test is run when the control circuit 200 sets the control variables PhaseA, PhaseB and AttF (via control signals CONTROL in FIG. 2) to the values of PhACr, PhBCr and AtFCr. The extracted signals A/D1, A/D2, A/D3, A/D4 will be indicative of the performance of the amplifier circuit 100 (FIG. 2) based on the control settings used in the new test (based on PhACr, PhBCr and AtFCr). After the test utilizing the contraction test set is run, there will be a new set of extracted signals A/D1, A/D2, A/D3, A/D4. At this point, the test counter Ct can be incremented (step 400) and the method continues at step 370 where the old worst case power Pw is set to the expansion or new test power Pr.

As stated earlier, the method 300 continues until there is a selected best power Pb that is less than or equal to the threshold power Pt (step 320) with an IMD PbImd less than or equal to the threshold IMD PtImd (step 326) or until the loop counter $C_L$ exceeds the loop limit Cn (step 322). If a best power Pb that is less than or equal to the threshold power Pt having an associated IMD that is less than or equal to the threshold IMD Imdt is found, then the method 300 has properly aligned the low distortion amplifier circuit of the present invention.

Figure 4:
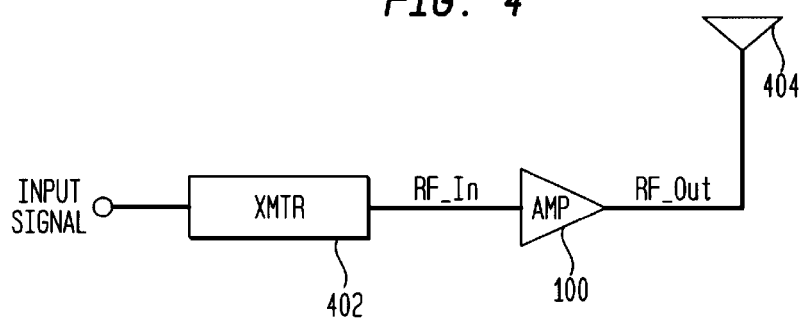
FIG. 4 is a high level block diagram illustrating an exemplary system utilizing the low distortion amplifier circuit illustrated in FIG. 2.

FIG. 4 is a high level block diagram illustrating an exemplary system 400 utilizing the low distortion amplifier circuit 100 with on-board automated alignment (illustrated in FIG. 2). The system 400 can be any wireless communication system, but is preferably a TDMA or CDMA system. The system 400 includes a transmitter (XMTR) circuit 402, the low distortion amplifier circuit 100 and an antenna 404. An input signal containing information to be transmitted to a wireless receiver, for example, is received by the XMTR 402. The XMTR 402 performs any signal conversion and processing necessary to communicate with the receiver and outputs RF signal RF_In to the amplifier circuit 100. As described above, the properly aligned amplifier circuit 100 outputs RF signal RF_Out to the antenna 404. The antenna 404 transmits the RF_Out signal.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An amplifier circuit with automated alignment, comprising:
   an amplification circuit, said amplification circuit having an input and a first output representing an amplification of a signal present at said input and a second output representing a first alignment indication of said amplification circuit;
   an extraction circuit connected to said first and second outputs and said input, said extraction circuit using signals present at said first and second outputs and at said input to extract a plurality of alignment indication signals, wherein said extraction circuit extracts an alignment indication signal representing an equal gain indication of said amplification circuit; and
   a control circuit connected to said plurality of alignment indication signals and said amplification circuit, said control circuit providing at least one control signal responsive to said plurality of alignment indication signals to adjust control variables of said amplification circuit.

2. The amplifier circuit of claim 1, wherein said control circuit adjusts a gain of said amplification circuit.

3. The amplifier circuit of claim 2, wherein said control circuit minimizes any intermodulation distortion of a signal being output at said first output.

4. The amplifier circuit of claim 2, wherein said control circuit minimizes any Spectral Regrowth of a signal being output at said first output.

5. The amplifier circuit of claim 1, wherein said amplification circuit comprises:
   a first coupler for splitting the signal present at said input into first and second input signal portions;
   a first amplifier for amplifying the said first input signal portion, said first amplifier producing a first amplified signal having a desired signal portion and an undesired signal portion;
   a phase shifting circuit for shifting the phase of the first amplified signal to form a second signal;
   a second coupler for combining the second input signal portion with the second signal to form a third signal;
   a second amplifier for amplifying the third signal, said second amplifier producing a second amplified signal having a desired signal portion and an undesired signal portion; and
   a combiner for combining said first and second amplified signals to form a fourth signal to be output at said first output, said combiner combining the desired signal portions of said first and second amplified signals, while substantially canceling the undesired signal portions of said first and second amplified signals.

6. The amplifier circuit of claim 5, wherein said first amplifier has at least one control variable for setting operating characteristics of said first amplifier.

7. The amplifier circuit of claim 6, wherein said at least one control variable controls an attenuation characteristic of said first amplifier.

8. The amplifier circuit of claim 6, wherein said at least one control variable controls a phase shifting characteristic of said first amplifier.

9. The amplifier circuit of claim 5, wherein said second amplifier has at least one control variable for setting operating characteristics of said second amplifier.

10. The amplifier circuit of claim 9, wherein said at least one control variable controls an attenuation characteristic of said second amplifier.

11. The amplifier circuit of claim 9, wherein said at least one control variable controls a phase shifting characteristic of said second amplifier.

12. The amplifier circuit of claim 5, wherein said phase shifting circuit has at least one control variable for setting operating characteristics of said phase shifting circuit.

13. The amplifier circuit of claim 12, wherein said at least one control variable controls an attenuation characteristic of said phase shifting circuit.

14. The amplifier circuit of claim 12, wherein said a t least one control variable controls a phase shifting characteristic of said phase shifting circuit.

15. The amplifier circuit of claim 5, wherein said extraction circuit extracts an alignment indication signal representing an equal gain indication of said amplification circuit.

16. The amplifier circuit of claim 1, wherein said control circuit comprises a programmed processor.

17. The amplifier circuit of claim 1, wherein said control circuit is an ASIC.

18. An amplifier circuit with automated alignment, comprising:
   an amplification circuit, said amplification circuit having an input and a first output representing an amplification of a signal present at said input and a second output representing a first alignment indication of said amplification circuit;
   an extraction circuit connected to said first and second outputs and said input, said extraction circuit using signals present at said first and second outputs and at said input to extract a plurality of alignment indication signals; and
   a control circuit connected to said plurality of alignment indication signals and said amplification circuit, said control circuit providing at least one control signal responsive to said plurality of alignment indication signals to adjust control variables of said amplification circuit,
   wherein said extraction circuit extracts four alignment indication signals.

19. The amplifier circuit of claim 18, wherein one of said alignment indication signals represents a signal present at said input.

20. The amplifier circuit of claim 18, wherein one of said alignment indication signals represent a signal present at said first output.

21. The amplifier circuit of claim 18, wherein one of said alignment indication signals represents an amount of signal distortion of a signal present at said first output.

22. The amplifier circuit of claim 18, wherein one of said alignment indication signals represents an amount of Spectral Regrowth of a signal present at said first output.

23. An amplifier circuit with automated alignment, comprising:
   an amplification circuit, said amplification circuit having an input and a first output representing an amplification of a signal present at said input and a second output representing a first alignment indication of said amplification circuit;
   an extraction circuit connected to said first and second outputs and said input, said extraction circuit using signals present at said first and second outputs and at said input to extract a plurality of alignment indication signals; and
   a control circuit connected to said plurality of alignment indication signals and said amplification circuit, said control circuit providing at least one control signal responsive to said plurality of alignment indication signals to adjust control variables of said amplification circuit, wherein said extraction circuit comprises:
      a first amplifier for amplifying the signal present at said input to form a second signal;
      a power divider for dividing signals present at said first output into third and fourth signals;
      a coupler for subtracting said second signal from said third signal to form a fifth signal representing undesired signal portions of signals present at said first output; and
      a plurality of digitizers for digitizing a signal present at said second output and said second, fourth and fifth signals into said plurality of alignment indication signals.

24. The amplifier circuit of claim 23, wherein each of said plurality of digitizers are analog-to-digital converters.

25. An amplifier circuit with automated alignment, comprising:
   an amplification circuit, said amplification circuit having an input and a first output representing an amplification of a signal present at said input and a second output representing a first alignment indication of said amplification circuit;
   an extraction circuit connected to said first and second outputs and said input, said extraction circuit using signals present at said first and second outputs and at said input to extract a plurality of alignment indication signals; and
   a control circuit connected to said plurality of alignment indication signals and said amplification circuit, said control circuit providing at least one control signal responsive to said plurality of alignment indication signals to adjust control variables of said amplification circuit, wherein said control circuit:
      a) conducts at least two alignment tests on said amplification circuit, each test having control variable settings for said amplification circuit;
      b) inputs said plurality of alignment indication signals for each test;
      c) compares said plurality of alignment indication signals to predetermined thresholds;
      d) determines if any of said plurality of alignment indication signals is below the predetermined thresholds; and
      e) sets said control settings with the control variable settings of the test associated with said plurality of alignment indication signals that are below the predetermined thresholds.

26. The amplifier circuit of claim 25, wherein if none of said plurality of alignment indication signals are below the predetermined thresholds, said control circuit:
   f) determines which test has the worst result based on said plurality of alignment indication signals;
   g) discards the test having the worst result;
   h) creates a new test having new control variable settings for the amplification circuit;
   i) conducts the new test on the amplification circuit;

j) inputs a plurality of alignment indication signals associated with the new test;
k) determines if said plurality of alignment indication signals associated with the new test is below the predetermined thresholds; and
l) sets said control settings with the control variable settings of the new test if its plurality of alignment indication signals are below the predetermined thresholds.

27. The amplifier circuit of claim 26 wherein said control circuit repeats steps (f) to (k) until a predetermined condition is met.

28. The amplifier circuit of claim 27, wherein the predetermined condition is a number of conducted tests.

29. The amplifier circuit of claim 27, wherein the predetermined condition is having a plurality of alignment indication signals that are below the predetermined thresholds.

30. The amplifier circuit of claim 26 wherein said control circuit creates a new test by performing a simplex method.

31. A transmitter for a wireless communication system, comprising:
a transmitter circuit connected to receive an input signal having a carrier component, said transmitter circuit having a first output;
an amplifier circuit, comprising:
an amplification circuit, said amplification circuit having an input connected to the first output and a second output representing an amplification of signals present at said input and a third output representing a first alignment indication of said amplification circuit,
an extraction circuit connected to said second and third outputs and said input, said extraction circuit using signals present at said input and at second and third outputs to extract a plurality of alignment indication signals, wherein said extraction circuit extracts an alignment indication signal representing an equal gain indication of said amplification circuit, and
a control circuit connected to said plurality of alignment indication signals and said amplification circuit, said control circuit providing at least one control signal responsive to said plurality of alignment indication signals to adjust control variables of said amplification circuit; and
an antenna for transmitting any signal present at said second output.

32. The transmitter of claim 31, wherein said control circuit adjusts a gain of said amplification circuit.

33. The transmitter of claim 32, wherein said control circuit minimizes any intermodulation distortion of a signal being output at said second output.

34. The transmitter of claim 32, wherein said control circuit minimizes any Spectral Regrowth of a signal being output at said second output.

35. The transmitter of claim 31, wherein said amplification circuit comprises:
a first coupler for splitting the signal present at said input into first and second input signal portions;
a first amplifier for amplifying the said first input signal portion, said first amplifier producing a first amplified signal having a desired signal portion and an undesired signal portion;
a phase shifting circuit for shifting the phase of the first amplified signal to form a second signal;
a second coupler for combining the second input signal portion with the second signal to form a third signal;
a second amplifier for amplifying the third signal, said second amplifier producing a second amplified signal having a desired signal portion and an undesired signal portion; and
a combiner for combining said first and second amplified signals to form a fourth signal to be output at said second output, said combiner combining the desired signal portions of said first and second amplified signals, while canceling the undesired signal portions of said first and second amplified signals.

36. The transmitter of claim 35, wherein said first amplifier has at least one control variable for setting operating characteristics of said first amplifier.

37. The transmitter of claim 36, wherein said at least one control variable controls an attenuation characteristic of said first amplifier.

38. The transmitter of claim 36, wherein said at least one control variable controls a phase shifting characteristic of said first amplifier.

39. The transmitter of claim 35, wherein said second amplifier has at least one control variable for setting operating characteristics of said second amplifier.

40. The transmitter of claim 39, wherein said at least one control variable controls an attenuation characteristic of said second amplifier.

41. The transmitter of claim 39, wherein said at least one control variable controls a phase shifting characteristic of said second amplifier.

42. The transmitter of claim 35, wherein said phase shifting circuit has at least one control variable for setting operating characteristics of said phase shifting circuit.

43. The transmitter of claim 42, wherein said at least one control variable controls an attenuation characteristic of said phase shifting circuit.

44. The transmitter of claim 42, wherein said at least one control variable controls a phase shifting characteristic of said phase shifting circuit.

45. The transmitter of claim 31, wherein said control circuit comprises a programmed processor.

46. The transmitter of claim 31, wherein said control circuit is an ASIC.

47. A transmitter for a wireless communication system, comprising:
a transmitter circuit connected to receive an input signal having a carrier component, said transmitter circuit having a first output;
an amplifier circuit, comprising:
an amplification circuit, said amplification circuit having an input connected to the first output and a second output representing an amplification of signals present at said input and a third output representing a first alignment indication of said amplification circuit,
an extraction circuit connected to said second and third outputs and said input, said extraction circuit using signals present at said input and at second and third outputs to extract a plurality of alignment indication signals, wherein said extraction circuit extracts four alignment indication signals, and
a control circuit connected to said plurality of alignment indication signals and said amplification circuit, said control circuit providing at least one control signal responsive to said plurality of alignment indication signals to adjust control variables of said amplification circuit; and
an antenna for transmitting any signal present at said second output.

48. The transmitter of claim 47, wherein one of said alignment indication signals represents the signal present at said input.

49. The transmitter of claim 47, wherein one of said alignment indication signals represent a signal present at said second output.

50. The transmitter of claim 47, wherein one of said alignment indication signals represents an amount of intermodulation distortion of a signal present at said first output.

51. The transmitter of claim 47, wherein one of said alignment indication signals represents an amount of Spectral Re growth of a signal present at said first output.

a first amplifier for amplifying the signal present at said input to form a second signal;
  a power divider for dividing signals present at said second output into third and fourth signals;
  a coupler for subtracting said second signal from said third signal to form a fifth signal representing undesired signal portions of signals present at said second output; and
  a plurality of digitizers for digitizing a signal present at said third output and said second, fourth and fifth signals into said plurality of alignment indication signals.

52. A transmitter for a wireless communication system, comprising:
  a transmitter circuit connected to receive an input signal having a carrier component, said transmitter circuit having a first output;
  an amplifier circuit, comprising:
    an amplification circuit, said amplification circuit having an input connected to the first output and a second output representing an amplification of signals present at said input and a third output representing a first alignment indication of said amplification circuit,
    an extraction circuit connected to said second and third outputs and said input, said extraction circuit using signals present at said input and at second and third outputs to extract a plurality of alignment indication signals, and
    a control circuit connected to said plurality of alignment indication signals and said amplification circuit, said control circuit providing at least one control signal responsive to said plurality of alignment indication signals to adjust control variables of said amplification circuit; and
  an antenna for transmitting any signal present at said second output, wherein said extraction circuit comprises:
    a first amplifier for amplifying the signal present at said input to form a second signal;
    a power divider for dividing signals present at said second output into third and fourth signals;
    a coupler for subtracting said second signal from said third signal to form a fifth signal representing undesired signal portions of signals present at said second output; and
    a plurality of digitizers for digitizing a signal present at said third output and said second, fourth and fifth signals into said plurality of alignment indication signals.

53. The transmitter of claim 52, wherein each of said plurality of digitizers are analog-to-digital converters.

54. A transmitter for a wireless communication system, comprising:
  a transmitter circuit connected to receive an input signal having a carrier component, said transmitter circuit having a first output;
  an amplifier circuit, comprising:
    an amplification circuit, said amplification circuit having an input connected to the first output and a second output representing an amplification of signals present at said input and a third output representing a first alignment indication of said amplification circuit,
    an extraction circuit connected to said second and third outputs and said input, said extraction circuit using signals present at said input and at second and third outputs to extract a plurality of alignment indication signals, and
    a control circuit connected to said plurality of alignment indication signals and said amplification circuit, said control circuit providing at least one control signal responsive to said plurality of alignment indication signals to adjust control variables of said amplification circuit; and
  an antenna for transmitting any signal present at said second output, wherein said control circuit:
    a) conducts at least two alignment tests on said amplification circuit, each test having control variable settings for said amplification circuit;
    b) inputs said plurality of alignment indication signals for each test;
    c) compares said plurality of alignment indication signals to predetermined thresholds;
    d) determines if any of said plurality of alignment indication signals is below the predetermined thresholds; and
    e) sets said control settings with the control variable settings of the test associated with said plurality of alignment indication signals that are below the predetermined thresholds.

55. The transmitter of claim 54, wherein if none of said plurality of alignment indication signals are below the predetermined thresholds, said control circuit:
  f) determines which test has the worst result based on said plurality of alignment indication signals;
  g) discards the test having the worst result;
  h) creates a new test having new control variable settings for the amplification circuit;
  i) conducts the new test on the amplification circuit;
  j) inputs a plurality of alignment indication signals associated with the new test;
  k) determines if said plurality of alignment indication signals associated with the new test is below the predetermined thresholds; and
  l) sets said control settings with the control variable settings of the new test if its plurality of alignment indication signals are below the predetermined thresholds.

56. The transmitter of claim 55 wherein said control circuit repeats steps (f) to (k) until a predetermined condition is met.

57. The transmitter of claim 56, wherein the predetermined condition is a number of conducted tests.

58. The transmitter of claim 56, wherein the predetermined condition is having a plurality of alignment indication signals that are below the predetermined thresholds.

59. The transmitter of claim 55 wherein said control circuit creates a new test by performing a simplex method.

60. An automated method of aligning control settings of an amplifier circuit to settings resulting in a desired operation of the circuit, comprising:

a) conducting at least two alignment tests on the amplifier circuit, each test having control variable settings for the amplifier circuit;

b) extracting a set of indication signals from the amplifier circuit for each test;

c) comparing the extracted indication signals to predetermined thresholds;

d) determining if any set of extracted indication signals is below the predetermined thresholds; and e) setting control settings of the amplifier circuit with the control variable settings of the test associated with the extracted indication signals that are below the predetermined thresholds.

61. The method of claim 60, wherein if none of the sets of extracted indication signals are below the predetermined thresholds, said method further comprises:

f) determining which test has the worst result based on the extracted indication signals;

g) discarding the test having the worst result;

h) creating a new test having new control variable settings for the amplifier circuit;

i) conducting the new test on the amplifier circuit;

j) extracting a set of indication signals from the amplifier circuit for the new test;

k) determining if the set of indication signals associated with the new test is below the predetermined thresholds; and l) setting control settings of the amplifier circuit with the control variable settings of the new if its extracted indication signals are below the predetermined thresholds.

62. The method of claim 61 wherein steps (f) to (k) are repeated until a predetermined condition is met.

63. The method of claim 62, wherein the predetermined condition is a number of conducted tests.

64. The method of claim 62, wherein the predetermined condition is having a set of extracted indication signals that are below the predetermined thresholds.

65. The method of claim 61 wherein the step of creating a new test is performed by a simplex method.

66. The method of claim 61, wherein the step of creating a new test comprises:

calculating a centroid for each control variable settings based on the control variable settings of prior tests; and calculating a reflection for each centroid.

67. The method of claim 61, wherein the step of creating a new test comprises:

calculating a centroid for each control variable settings based on the control variable settings of prior tests; and calculating a contraction for each centroid.

68. The method of claim 61, wherein the step of creating a new test comprises:

calculating a centroid for each control variable settings based on the control variable settings of prior tests; and calculating an expansion for each centroid.

69. The method of claim 60, wherein a number of tests is V+1, where V is a number of control variables within each test.

70. The method of claim 60, wherein one of the extracted indication signals represents an input signal applied to the amplifier circuit.

71. The method of claim 60, wherein one of the extracted indication signals represents an output signal of the amplifier circuit.

72. The method of claim 60, wherein one of the extracted indication signals represents an amount of signal distortion of an output signal of the amplifier circuit.

73. The method of claim 60, wherein one of the extracted indication signals represents an amount of Spectral Re growth of an output signal of the amplifier circuit.

74. The method of claim 72, wherein one of the predetermined thresholds is a minimum amount of signal distortion of the output signal.

75. The method of claim 60, wherein one of the extracted indication signals represents an equal gain indication of the amplifier circuit.

76. The method of claim 75, wherein one of the predetermined thresholds is a value indicative of an equal gain.

77. An automated method of aligning control settings of an amplifier circuit that signals output by the circuit have a desired signal level with minimum distortion, said method comprising:

a) inputting a signal having a carrier portion into the amplifier circuit;

b) conducting at least two alignment tests on the amplifier circuit, each test having control variable settings for the amplifier circuit;

c) extracting a set of indication signals from the amplifier circuit for each test, said indication signals indicative of the operation of the amplifier circuit on the input signal;

d) comparing the extracted indication signals to predetermined thresholds;

e) determining if any set of extracted indication signals is below the predetermined thresholds; and f) setting control settings of the amplifier circuit with the control variable settings of the test associated with the extracted indication signals that are below the predetermined thresholds.

78. The method of claim 77, wherein if none of the sets of extracted indication signals are below the predetermined thresholds, said method further comprises:

g) determining which test has the worst result based on the extracted indication signals;

h) discarding the test having the worst result;

i) creating a new test having new control variable settings for the amplifier circuit;

j) conducting the new test on the amplifier circuit;

k) extracting a set of indication signals from the amplifier circuit for the new test;

l) determining if the set of indication signals associated with the new test is below the predetermined thresholds; and m) setting control settings of the amplifier circuit with the control variable settings of the new if its extracted indication signals are below the predetermined thresholds.

79. The method of claim 79 wherein steps (g) to (m) are repeated until a predetermined condition is met.

80. The method of claim 79, wherein the predetermined condition is a number of conducted tests.

81. The method of claim 79, wherein the predetermined condition is having a set of extracted indication signals that are below the predetermined thresholds.

82. The method of claim 78 wherein the step of creating a new test is performed by a simplex method.

* * * * *